United States Patent
Matter et al.

(10) Patent No.: US 6,542,100 B1
(45) Date of Patent: Apr. 1, 2003

(54) APPARATUS AND METHOD FOR FILTERING A SIGNAL WHICH REPRESENTS A DIGITAL DATA STREAM

(75) Inventors: Udo Matter, Düsseldorf (DE); Stefan Van Waasen, Duisburg (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/606,528

(22) Filed: Jun. 30, 2000

(30) Foreign Application Priority Data

Jun. 30, 1999 (DE) .......................... 199 30 113

(51) Int. Cl.⁷ .............................................. H03M 1/80
(52) U.S. Cl. ...................... 341/153; 341/141; 341/143; 341/144; 341/150; 324/366; 324/391; 324/453
(58) Field of Search ................................ 341/143, 141, 341/144, 153; 324/366, 391, 453

(56) References Cited

U.S. PATENT DOCUMENTS

| | | | | |
|---|---|---|---|---|
| 3,543,009 A | * | 11/1970 | Voelcker, Jr. ............ | 235/150.4 |
| 4,107,610 A | * | 8/1978 | Weber .......................... | 325/38 |
| 4,580,128 A | | 4/1986 | Ogita et al. | |
| 4,791,406 A | | 12/1988 | Mehrgardt et al. | |
| 4,935,740 A | * | 6/1990 | Schouwenhaars et al. .. | 341/135 |
| 5,323,157 A | * | 6/1994 | Ledzius et al. ............. | 341/143 |
| 5,625,357 A | * | 4/1997 | Cabler ......................... | 341/143 |
| 5,659,466 A | | 8/1997 | Norris et al. | |
| 5,815,104 A | * | 9/1998 | Jackson et al. ............. | 341/144 |
| 5,815,537 A | * | 9/1998 | Janssen ...................... | 375/350 |
| 5,870,044 A | * | 2/1999 | Dell'ova et al. ............ | 341/120 |
| 5,995,030 A | * | 11/1999 | Cabler ........................ | 341/143 |
| 6,067,327 A | * | 5/2000 | Creigh et al. ............... | 375/295 |
| 6,072,340 A | * | 6/2000 | Deisch ........................ | 327/100 |
| 2002/0089440 A1 | * | 7/2002 | Kranz et al. ................ | 341/143 |

FOREIGN PATENT DOCUMENTS

| WO | WO 97/04525 | 2/1997 |
|---|---|---|
| WO | WO 00/65789 | 11/2000 |

OTHER PUBLICATIONS

"A CMOS oversampling D/A converter with a current–mode semidigital reconstruction filter"; Su, D.K.; Wooley, B.A.; Solid–State Circuits, IEEE Journal of, vol.: 28 Issue: 12, Dec. 1993; pp.: 1224–1233.*

"A CMOS oversampling D/A converter with a current–mode semi–digital reconstruction filter"; Su, D.K.; Wooley, B.A.; Solid–State Circuits Conference, 1993. Digest of Technical Papers. 40th ISSCC., 1993 IEEE International, 1993; pp.: 230–231.*

"A CMOS oversampling D/A converter with a current–mode semidigital reconstruction filter"; Su, D.K.; Wooley, B.A.; Solid–State Circuits, IEEE Journal of, vol.: 28 Issue: 12, Dec. 1993; pp.: 1224–1233.*

"A CMOS oversampling D/A converter with a current–mode semi–digital reconstruction filter"; Su, D.K.; Wooley, B.A.; Solid–State Circuits Conference, 1993. Digest of Technical Papers. 40th ISSCC., 1993 IEEE International, 1993; pp.: 230–231.*

Analog Devices: Digital–to–Analog Converters 1992, 2–371 to 2–381.

Analog Devices: Communications Products 1991 4–59 to 4–74.

U. Tietze et al., 1986 Halbleiterschaltungstechnik, 8, 740–744.

* cited by examiner

*Primary Examiner*—Michael Tokar
*Assistant Examiner*—Khai Nguyen
(74) *Attorney, Agent, or Firm*—Morrison & Foerster LLP

(57) ABSTRACT

A signal to be produced, which represents a digital data stream, is generated using the currents or voltages from current or voltage sources selected from multiple current or voltage sources. The current or voltage sources whose currents or voltages are used to generate the signal which is to be produced are selected based on the contents of the elements of a shift register whose input connection has the signal which is to be filtered applied to it.

12 Claims, 1 Drawing Sheet

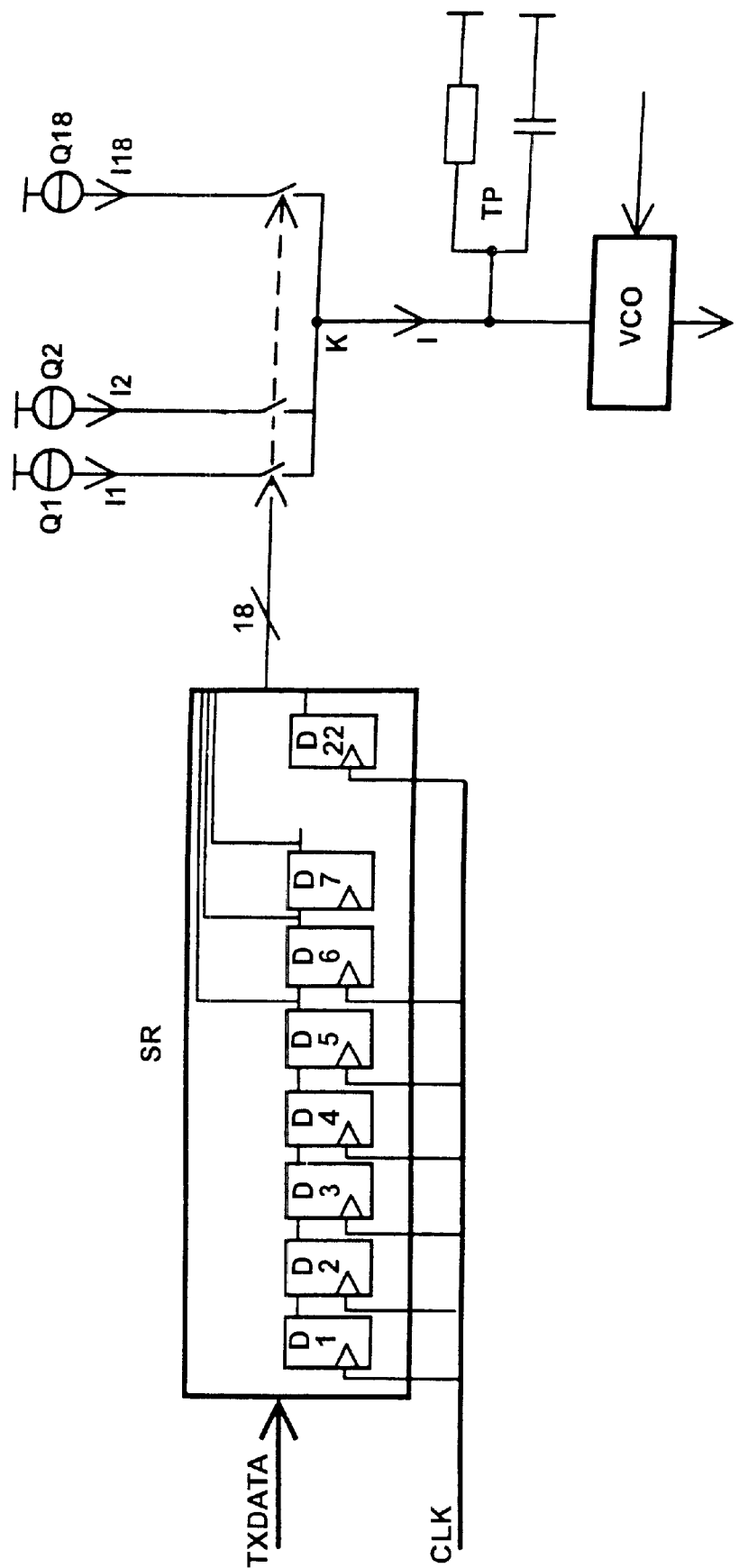

APPARATUS AND METHOD FOR FILTERING A SIGNAL WHICH REPRESENTS A DIGITAL DATA STREAM

This application is based on German priority application 19930113.1, which is hereby incorporated in its entirety by reference.

TECHNICAL FIELD OF THE INVENTION

The present invention relates and method for filtering a signal, and in particular, to an apparatus and method for filtering a signal which represents a digital data stream.

BACKGROUND OF THE INVENTION

Systems and methods for filtering signals in information transfer systems are desired, in which the information which is to be transmitted (the digital data stream) is represented by a digital data stream and is modulated onto a high-frequency carrier for transmission. For example, such a system is a system operating on the basis of the DECT standard.

In cases where the digital data stream is modulated onto the high-frequency carrier directly (unfiltered), the resulting signal occupies a very broad frequency spectrum. This is due to the spasmodic nature of the curve of the signal to be modulated onto the carrier, particularly when a plurality of transmission channels with relatively close carrier frequencies are required. For this reason, the data to be transmitted should preferably be subjected to low-pass filtering before it is modulated onto the carrier signal.

Low-pass filtering can be accomplished, for example, using a filter comprising resistors, capacitors and/or inductors. The design of such a filter involves a relatively high degree of complexity, requiring a large number of components. Additionally, the technical data of the components used must not or must only slightly differ from firmly stipulated nominal values.

Another example of filtering a signal (which represents a digital data stream) is to form the signal, by the sum of the output currents or output voltages from a multiplicity of current sources or voltage sources, the current sources or voltage sources being turned on and/or off (for example using the so-called thermometer code) based on the curve of the signal which is to be filtered.

SUMMARY OF THE INVENTION

This invention is direct to an apparatus and method for filtering a signal which represents a digital data stream, the signal to be produced being generated using the currents or voltages from current or voltage sources selected from a multiplicity of current or voltage sources.

In one embodiment of the invention, there is provided an apparatus for filtering a signal which represents a digital data stream. The signal to be produced is generated using the currents or voltages from current or voltage sources selected from multiple current or voltage sources.

In another embodiment of the invention, the filtering carried out by the apparatus is performed by filtering a signal which represents a digital data stream. The signal to be produced is generated using the currents or voltages from current or voltage sources selected from a multiplicity of current or voltage sources.

Apparatuses and methods of this type are advantageous because the current sources or voltage sources, in contrast to the elements of the aforementioned filters, can easily be accommodated in integrated circuits, and because tolerances in the technical data for the components used are easier to handle or to offset than tolerances in the components of a conventional filter. On the other hand, the control device driving the current sources or voltage sources (the control device which determines which current source or voltage source is to be turned on and turned off, and when) is relatively complicated. Furthermore, practical implementation in the case of particular integrated circuits (for example in the case of RF modules in which bipolar or BiCMOS technology is used) can take up a relatively large amount of chip surface, which significantly increases the cost of the particular chip.

The present invention is therefore based on an apparatus and method for filtering a signal. The signal represents a digital data stream, and the signal to be produced is generated using the currents or voltages from current or voltage sources selected from multiple current or voltage sources. In this regard, the signals which represent digital data streams can be filtered as desired with a minimum degree of complexity.

In one aspect of the invention, the current or voltage sources whose currents or voltages are used to generate the signal are selected on the basis of the contents of the elements of a shift register (shift register contents) whose input connection has the signal which is to be filtered applied to the input connection.

In another aspect of the invention, the signal which is to be filtered is applied to a shift register, and the current or voltage sources whose currents or voltages are used to produce the signal on the basis of the content of the shift register elements are selected. Only one shift register is required to drive the current or voltage sources, i.e., to define which current or voltage sources need to be turned on and turned off, and when.

Furthermore, the device which drives the current or voltage sources (the shift register) can be accommodated in a very small space (even with integration in any desired integrated circuits).

Signals which represent digital data streams can thus be filtered as desired with a minimum degree of complexity.

BRIEF DESCRIPTION OF THE FIGURE

FIG. 1 shows an apparatus for filtering signals which represent digital data streams in accordance with the present invention.

DETAILED DESCRIPTION OF THE INVENTION

The apparatus and method described below relate to filtering a signal which represents a digital data stream. The signal to be produced is generated using current or voltage sources selected from a multiplicity of current or voltage sources.

The apparatus is a component part of a system operating, for example, on the basis of the so-called DECT standard. Systems operating on the basis of the DECT standard are typically communication systems. In these systems, information which is to be interchanged between transmission and/or reception stations is converted into digital data streams and modulated onto a high-frequency carrier. During this process, the digital data stream is filtered, as described below, before being modulated onto the high-frequency carrier. This filtering is intended to ensure that the bandwidth of the carrier modulated with the digital data stream is kept to a minimum.

The apparatus and method described can, of course, also be used in other systems for other purposes.

In one embodiment, the apparatus is at least partly accommodated in an integrated circuit. However, there is no restriction in this regard either. The apparatus can also be fully or partly constructed outside integrated circuits using discrete elements.

The filtering, described in more detail below, converts the digital data stream which is to be filtered into a signal having a gaussian curve. In practice, the apparatus and method of the invention can also be used to produce any other filter characteristics.

The apparatus for filtering according to the invention differs in that the current or voltage sources (whose currents or voltages are used to generate the signal which is to be produced) are selected on the basis of the contents of the elements of a shift register whose input connection has the signal which is to be filtered applied to it.

In one embodiment, current sources are used. In another embodiment, voltage sources are used.

FIG. 1 illustrates the apparatus used for filtering signals. In FIG. 1, the apparatus comprises eighteen current sources Q1, Q2 . . . Q18, switches S1, S2 . . . S18, a shift register SR having twenty-two shift register elements D1, D2, . . . D22, and a low-pass filter TP. The signal to be filtered is denoted by TXDATA (see, FIG. 1).

The current sources Q1 to Q18 produce currents I1 to I18, respectively, which are passed via the switches S1 to S18 to a common node K. Current I1 to I18 add up at node K to produce a total current I. In this arrangement, the switch S1 is arranged in the current path of the current I1, the switch S2 is arranged in the current path of the current I2, the switch S3 is arranged in the current path of the current I3, . . . , and the switch S18 is arranged in the current path of the current I18.

In this example, the currents I1 to I18 have different magnitudes, although the currents I1 and I18, I2 and I17, I3 and I16, I4 and I15, I5 and I14, I6 and I13, I7 and I12, I8 and I11, and I9 and I10 have the same magnitude. The currents increase from I1 to I9. It is advantageous if there is a setting device (not shown in the figure) which can be used to vary the currents produced by the current sources, individually or jointly, by a particular value or a particular factor.

The switches S1 to S18 are used to turn the current sources Q1 to Q18 on and off or to interrupt the paths carrying the currents I1 to I18 before the node K.

The switches S1 to S18 are actuated on the basis of the contents of the shift register elements D5 to D22. More specifically, the switch S1 is actuated on the basis of the content of the shift register element D5, the switch S2 is actuated on the basis of the content of the shift register element D6, the switch S3 is actuated on the basis of the content of the shift register element D7, the switch S4 is actuated on the basis of the content of the shift register element D8, the switch S5 is actuated on the basis of the content of the shift register element D9, the switch S6 is actuated on the basis of the content of the shift register element D10, the switch S7 is actuated on the basis of the content of the shift register element D11, the switch S8 is actuated on the basis of the content of the shift register element D12, the switch S9 is actuated on the basis of the content of the shift register element D13, the switch S10 is actuated on the basis of the content of the shift register element D14, the switch S11 is actuated on the basis of the content of the shift register element D15, the switch S12 is actuated on the basis of the content of the shift register element D16, the switch S13 is actuated on the basis of the content of the shift register element D17, the switch S14 is actuated on the basis of the content of the shift register element D18, the switch S15 is actuated on the basis of the content of the shift register element D19, the switch S16 is actuated on the basis of the content of the shift register element D20, the switch S17 is actuated on the basis of the content of the shift register element D21, and the switch S18 is actuated on the basis of the content of the shift register element D22.

The first four shift register elements D1 to D4 are not connected to any of the switches S1 to S18.

The shift register elements D1 to D22 are in the form of D flip-flops in one embodiment of the invention, as shown in FIG. 1. However, they can also be in the form of any other elements known to the skilled artisan which can be used as shift register elements.

The input connection of the shift register SR has the signal TXDATA, which is to be filtered, applied to it. Hence, the current sources Q1 to Q18, or the currents produced by the current sources, are switched according to the curve of the signal.

The signal TXDATA is a digital data stream which, in this example, has a bit frequency of 1 Mbit/s. The shift frequency (the frequency of the clock signal CLK supplied to the shift register elements D1 to D22) is 13 MHz in this example. That is, 13 times the bit frequency of the digital data stream which is to be filtered. Hence, a bit applied to the shift register for the length of one bit clock pulse is transferred to the first shift register element D1 and shifted another 13 times.

One skilled in the art will recognize that there is no restriction on the frequencies and their relative magnitudes, and the bit and shift frequencies can have any magnitude independently of one another.

With switches S1 to S18 turned off and a "1" permanently applied to the input connection of the shift register, the following conditions are established. While a "1" is applied to the input connection of the shift register, a "1" is transferred to the first shift register element D1 and shifted again at the shift clock frequency. Hence, "1" applied to the shift register input connection is transformed into a "1" sequence migrating through the shift register. With the fifth shift clock pulse, the first "1" in the "1" sequence reaches the shift register element D5 controlling the switch S1. From that point on, the switches S1 to S18 are turned on sequentially at the shift clock frequency, and are kept turned on by the advancing "1"s in the "1" sequence. With each turn-on procedure, the total current established at the node K rises. This rise in current is not, however, abrupt, contrary to the filtered signal. More specifically, in steps at the rhythm of the shift clock frequency, the exact curve of the rise depends on the shift frequency and on the size of the currents produced by the current sources Q1 to Q18.

Similarly, with switches S1 to S18 turned on, if a "0" is applied to the input connection of the shift register the following conditions are established. When a "0" is applied to the input connection of the shift register, a "0" is transferred to the first shift register element D1 and shifted again at the shift clock frequency. Hence, the "0" applied to the shift register input connection is transformed into a "0" sequence migrating through the shift register. With the fifth shift clock pulse, the first "0" in the "0" sequence reaches the shift register element D5 controlling the switch S1. From that point on, the switches S1 to S18 are turned off sequentially at the shift clock frequency, and are kept turned off by the advancing "0"s in the "0" sequence. With each turn-off procedure, the total current established at the node K falls. This fall in current is not, however, abrupt, contrary to the filtered signal. More specifically, in steps at the rhythm of the shift clock frequency, the exact curve of the fall depends on the shift frequency and on the size of the currents produced by the current sources Q1 to Q18.

In normal operation, where the values applied to the shift register input connection frequently (according to the content of the digital data stream which is to be filtered) change, at least some of the procedures differ. The reason for this is that a "1" applied to the shift register input connection for the length of 1 bit clock pulse is transformed into a "1" sequence. The sequence comprises "only" 13 "1"s. When a "0" is applied to the shift register input connection for the length of 1 bit clock pulse, it is transformed into a "0" sequence which comprises "only" 13 "0"s. The effects of this sequence are explained below using the bit sequences 0010 and 0011.

In the bit sequence 0010, a "0" is first applied to the shift register input connection for the length of two bit clock pulses. This is followed by a "1" for the length of one bit clock pulse, and by another "0" for the length of one bit clock pulse. When the relevant values are applied to the shift register input connection, they are transferred to the first shift register element D1 and then shifted 13 times each. This results in the data stream shifted by the shift register comprising 26 zeros, 13 ones and another 13 zeros. When a "1" is first applied to the shift register input connection, nothing occurs apart from the procedures taking place in the shift register. The switches S1 to S18 remain off. When the first "1" in the "1" sequence reaches the shift register element D5, switch S1 is turned on. Specifically, when a "1" is written to the shift register element D5, the switch S1 is turned on and the current I1 flows to the node K. With the next shift clock pulse, the first "1" in the "1" sequence reaches the shift register element D6. When a "1" is written to the shift register element D6, the switch S2 is turned on and the current I2 flows to the node K. At this instant, the shift register element D5 contains the second "1" in the "1" sequence and the switch S1 remains turned on. Consequently, the currents I1 and I2 flow through the node K, producing a sum of the currents. Subsequent shift procedures turn the remaining switches on as "1"s are written into respective register elements. Hence, the current flowing through the node K continue to rise as additional current flows through the node K. This process continues until the first "1" in the "1" sequence reaches the shift register element D17. When a "1" is written to the shift register element D17, the switch S13 is turned on, which means that the current I13 can flow to the node K. At this instant, the shift register elements D5 to D16 contain the last 12 "1"s in the "1" sequence and the switches S1 to S12 remain turned on. Consequently, the currents I1 to I13 can now flow to the node K, producing the sum of the currents.

In the meantime, the shift register elements D1 to D4 contain the first four "0"s in the "0" sequence adjoining the "1" sequence. However, the current established at the node K is not affected since the shift register elements D1 to D4 do not actuate any switches. With the next shift clock pulse, the first "1" in the "1" sequence reaches the shift register element D18. When a "1" is written to the shift register element D18, the switch S14 is turned on and the current I14 flows to the node K. At the same time, the first "0" in the "0" sequence adjoining the "1" sequence reaches the shift register element D5. When a "0" is written to the shift register element D5, the switch S1 is turned off and the current I1 no longer flows to the node K. Consequently, the currents I2 to I14 now flow to the node K, producing a sum of currents. Since, in this example, I1 is smaller than I14, the current flowing through the node K still rises slightly compared to the previous shift clock pulse. With the next shift clock pulse, the first "1" in the "1" sequence reaches the shift register element D19. When a "1" is written to the shift register element D19, the switch S15 is turned on and the current I15 flows to the node K. At the same time, the first "0" in the "0" sequence adjoining the "1" sequence reaches the shift register element D6. When a "0" is written to the shift register element D6, the switch S2 is turned off and the current I2 no longer flows to the node K. Consequently, the currents I3 to I15 now flow to the node K, producing the sum of currents. Since, in this example, I2 is smaller than I15, the current flowing through the node K still rises slightly compared to the previous shift clock pulse. The subsequent shift procedures turn the remaining switches on and off as bits are received in respective registers. However, the current flowing through the node K does not continue to rise. Rather, the current at first remains the same (I3=I16) and then falls (I4>I17; I5>I18). As of the shift clock pulse at which the first "0" in the "0" sequence adjoining the "1" sequence reaches the shift register element D10, switches are now (at least temporarily) turned off. No more switches are turned on at this time. Specifically, when a "0" is written to the shift register element D10, the switch S6 is turned off and the current I6 no longer flows to the node K (without another switch being turned on at the same time). Consequently, only the currents I7 to I18 can flow to the node K to produce a sum of currents. Subsequent shift procedures continue to turn off one switch after the other. Hence, the current flowing through the node K continue to falls. The extent to which the current falls depends on whether the "0" sequence shifted through the shift register is adjoined by a further "0" sequence or a "1" sequence. If the "0" sequence is adjoined by a further "0" sequence, the switches S1 to S18 are turned off at some point in time and the current flowing through the node K becomes zero. If the "0" sequence is adjoined by a "1" sequence, at least five of the switches S1 to S18 remain turned on and the current flowing through the node K does not become zero.

When a 0011 sequence of the signal is to be filtered (and is applied to the shift register input connection), a "0" is first applied to the shift register input connection for the length of two bit clock pulses, followed by a "1" for the length of two bit clock pulses. In the time in which the respective values are applied to the shift register input connection, they are transferred to the first shift register element D1 and shifted an additional 13 times each, so that the data stream shifted through the shift register comprises 26 zeros and 26 ones. As this data stream is shifted through the shift register, up to the instant at which the first "1" in the first "1" sequence reaches the shift register element D17, the same procedures take place as in the case of the 0010 sequence, described above. When a "1" is written to the shift register element D18, the switch S14 is turned on and the current I14 flows to the node K. At the same time, the first "1" in the "1" sequence adjoining the first "1" sequence reaches the shift register element D5. The writing of a "1" to the shift register element D5 keeps the switch S1 turned on and the current I1 continues to flow to the node K. Consequently, the currents I1 to I14 can flow to the node K, producing a sum of currents. With the next shift clock pulse, the first "1" in the first "1" sequence reaches the shift register element D19. When a "1" is written to the shift register element D19, the switch S15 is turned on and the current I15 flows to the node K. At the same time, the first "1" in the second "1" sequence, adjoining the first "1" sequence, reaches the shift register element D6, and the second "1" in the second "1" sequence reaches the shift register element D5. The writing of a "1" to the shift register elements D5 and D6 keeps the switches S1 and S2 turned on. Hence, the currents I1 and I2 continue to flow to the node K. Consequently, the currents I1 to I15 can flow to the node K, producing a sum of currents. Subsequent shift procedures continue to turn on one switch after the other, such that the current flowing through the node K continues to rise. Finally, the switches S1 to S18 are turned on and the currents I1 to I18 can flow to the node K and can add up there.

The current flowing through the node K varies on the basis of the curve of the signal which is to be filtered (and is applied to the shift register input connection). The current flowing through the node K has a stepped curve, the height of the steps depending on the size of the currents I1 to I18, and the depth of the steps depending on the length of the shift clock pulse.

The current flowing through the K node is smoothed by the low-pass filter TP (in the exemplary figure, accommodated outside an integrated circuit containing the remainder of the arrangement). The resultant signal is the product of filtering the signal which is to be filtered. The resultant signal is modulated onto a high-frequency carrier (frequency modulation). In one embodiment, this is done by applying it to the control input of a voltage controlled oscillator, denoted by VCO in the figure. The signal output from the voltage controlled oscillator VCO is the result of modulating the filtered signal onto a high-frequency carrier. It ought to be clear that apparatuses of the type described above can be used to produce not only gauss filters. In principle, they can also be used to produce any other filter characteristics. In this regard, depending on the desired result, it may be desirable, by way of example,

- to provide one or more current or voltage sources, differently;
- to define the sizes and/or ratios of the currents or voltages produced by the current or voltage sources, differently;
- to provide more or fewer shift register elements;
- to provide a different ratio between the bit frequency and the shift frequency;
- to provide more or fewer shift register elements which actuate no switches;
- to place the shift register elements which actuate no switches in a different position within the shift register;
- to provide other associations between the shift register elements and the switches; and/or
- to make actuation of the switches dependent on the result of a logic combination of the contents of a plurality of shift register elements or other signals,
- where it may be found to be advantageous if individual, a plurality or all of the possible modifications are settings which can be varied by the manufacturer or the user, statically or dynamically.

The apparatus described and the method described allow signals which represent digital data streams to be filtered as desired with a minimum degree of complexity, irrespective of the details of the practical implementation.

Further variations and modifications of the foregoing will be apparent to those skilled in the art and are intended to be encompassed by the claims appended herewith.

We claim:

1. An apparatus for filtering a signal which represents a digital data stream, the signal to be produced being generated using currents or voltages from multiple current or voltage sources, wherein the currents or voltages generate a signal and are selected based on shift register contents, and an input connection of said shift register has the signal to be filtered applied to the input connection, the currents or voltages which are used to generate the signal are selected using switches for turning the current or voltage sources on and off, the currents or voltages which are used to generate the signal are selected using switches which can be used to interrupt paths carrying the currents or the voltages, the switches are actuated based on shift register content, and the shift register content includes shift register elements which have no associated switch.

2. The apparatus according to claim 1, wherein a shift frequency at which data is applied to the input connection of the shift register is transferred to the first shift register element and is also shifted as a multiple of bit frequency of the digital data stream represented by the signal which is to be filtered.

3. The apparatus according to claim 1, wherein the switches are each actuated based on a specified shift register content.

4. The apparatus according to claim 1, wherein the signal comprises the currents or voltages from respectively selected current or voltage sources.

5. The apparatus according to claim 4, wherein the currents or voltages from the respectively selected current or voltage sources are added.

6. The apparatus according to claim 5, wherein the signal which results from the addition of the currents or voltages is subjected to low-pass filtering.

7. The apparatus according to claim 1, wherein the filtering of the signal to be filtered is gauss filtering.

8. A method for filtering a signal which represents a digital data stream, the signal being generated using currents or voltages from multiple current or voltage sources, comprising:

applying the signal to be filtered to a shift register; and selecting the current or voltage sources wherein the currents or voltages are used to produce the signal which is to be generated, based on shift register content, wherein the currents or voltages which are used to generate the signal are selected using switches for turning the current or voltage sources on and off, the currents or voltages which are used to generate the signal are selected using switches which can be used to interrupt paths carrying the currents or the voltages, the switches are actuated based on shift register content, and the shift register content includes shift register elements which have no associated switch.

9. A device for filtering a signal representing a digital data flow, comprising:

a first unit to generate the signal using currents or voltages selected from a plurality of current or voltage sources, wherein the selected current or voltage sources whose currents and voltages, respectively, are used to generate the signal and are based on contents of elements of a shift register having an input connection to which the signal is applied, and the frequency with which data are accepted and passed on in the shift register is larger, by a factor greater than 1 and less than the number of shift register elements, than a bit frequency of the signal.

10. A method for filtering a signal representing a digital data flow, comprising:

generating the signal using currents or voltages selected from a plurality of current or voltage sources, wherein the selected current or voltage sources whose currents and voltages, respectively, are used to generate the signal and are based on contents of elements of a shift register having an input connection to which the signal is applied, and the frequency with which data are accepted and passed on in the shift register is larger, by a factor greater than 1 and less than the number of shift register elements, than a bit frequency of the signal.

11. A device for filtering a signal representing a digital data flow, comprising:

a first unit to generate the signal using currents or voltages selected from a plurality of current or voltage sources, wherein the selected current or voltage sources whose currents and voltages, respectively, are used to generate the signal are based on contents of elements of a shift register having an input connection to which the signal is applied, and the frequency with which data are accepted and passed on in the shift register is larger, by a factor greater than 1 and less than the number of current or voltage sources, than a bit frequency of the signal.

12. A method for filtering a signal representing a digital data flow, comprising:

generating the signal using currents or voltages selected from a plurality of current or voltage sources, wherein the selected current or voltage sources whose currents and voltages, respectively, are used to generate the signal are based on the contents of elements of a shift register having an input connection to which the signal is applied, and the frequency with which data are accepted and passed on in the shift register is larger, by a factor greater than 1 and less than the number of current or voltage sources, than a bit frequency of the signal.

* * * * *